US009645203B2

(12) United States Patent
Kaufmann et al.

(10) Patent No.: US 9,645,203 B2
(45) Date of Patent: May 9, 2017

(54) MAGNETIC FIELD MEASURING DEVICE

(71) Applicant: Micronas GmbH, Freiburg (DE)

(72) Inventors: Timo Kaufmann, Waldkirch-Suggental (DE); Klaus Heberle, Emmendingen (DE); Joerg Franke, Freiburg (DE); Oliver Breitwieser, Gundelfingen (DE)

(73) Assignee: Micronas GmbH, Freiburg (DE)

( * ) Notice: Subject to any disclaimer, the term of this patent is extended or adjusted under 35 U.S.C. 154(b) by 51 days.

(21) Appl. No.: 14/816,783

(22) Filed: Aug. 3, 2015

(65) Prior Publication Data
US 2016/0033587 A1    Feb. 4, 2016

(30) Foreign Application Priority Data

Aug. 1, 2014  (DE) .................. 10 2014 011 245

(51) Int. Cl.
*G01R 33/07* (2006.01)
*G01D 5/14* (2006.01)

(52) U.S. Cl.
CPC ............. *G01R 33/07* (2013.01); *G01D 5/147* (2013.01)

(58) Field of Classification Search
CPC ........... H01L 2924/3025; H01L 25/162; H01L 43/04; H01L 43/065; H01L 21/67276; G01R 33/07; G01R 33/02; G01R 33/09; G01R 15/207; G01R 33/038; G01R 31/318547; G01R 33/0017; G01R 33/072; G01R 33/12; G01R 33/1276; G01D 5/24457; G01D 11/24; G01D 11/245; G01D 21/00; G01D 5/14; G01D 5/165; G01N 25/72; G01N 27/745; G01N 33/54326; G01P 3/488; G01P 13/045; G01P 3/481; G01P 3/487; G06F 3/033; G06F 3/0383;
(Continued)

(56) References Cited

U.S. PATENT DOCUMENTS 7,250,760 B2    7/2007 Ao
2009/0001972 A1*  1/2009 Fernandez ......... G01D 5/24452
                                                       324/207.26
(Continued)

FOREIGN PATENT DOCUMENTS

DE    698 16 755 T2    6/2004
EP    2 607 857 A2     6/2013
(Continued)

*Primary Examiner* — Vinh Nguyen
(74) *Attorney, Agent, or Firm* — Muncy, Geissler, Olds & Lowe, P.C.

(57) ABSTRACT

A magnetic field measuring device includes a first semiconductor body having a surface formed in a first x-y plane, the first semiconductor body having two magnetic field sensors, spaced a distance apart on the surface, and the magnetic field sensors each measuring one z component of a magnetic field. A first magnet has a planar main extension surface formed in a second x-y plane, the direction of magnetization changing from a north pole to a south pole along the main extension surface on a symmetry surface of the magnet. One of the two magnetic field sensors being disposed in the vicinity of the north pole and the other of the two magnetic field sensors being situated in the vicinity of the south pole, so that signals having opposite polarities with respect to each other are formed in a z component of the magnetic field.

13 Claims, 2 Drawing Sheets

(58) Field of Classification Search
CPC ...... G06F 1/1628; H01F 27/34; H01F 27/402; H01F 27/42
See application file for complete search history.

(56) References Cited

U.S. PATENT DOCUMENTS

| | | | | |
|---|---|---|---|---|
| 2013/0154618 A1* | 6/2013 | Heberle | .................. | G01B 7/00 324/207.2 |
| 2014/0333298 A1* | 11/2014 | Heberle | ............. | G01R 33/0017 324/228 |
| 2014/0333299 A1* | 11/2014 | Heberle | ............... | G01R 33/038 324/228 |
| 2015/0050013 A1* | 2/2015 | Cadugan | ................ | G01B 7/003 396/133 |

FOREIGN PATENT DOCUMENTS

| JP | S 58-142203 A | 8/1983 |
|---|---|---|
| JP | 2001-059744 A | 3/2001 |
| JP | 2001-174284 A | 6/2001 |

\* cited by examiner

MAGNETIC FIELD MEASURING DEVICE

This nonprovisional application claims priority under 35 U.S.C. §119(a) to German Patent Application No. 10 2014 011 245.4, which was filed in Germany on Aug. 1, 2014, and which is herein incorporated by reference.

BACKGROUND OF THE INVENTION

Field of the Invention

The invention relates to a magnetic field measuring device.

Description of the Background Art

An arrangement of a Hall sensor and a magnet is known from EP 2 607 857 A2, in which a Hall voltage is generated by approaching a ferromagnetic plate in the Hall sensor. Different approaches to designing a magnetic field measuring device are furthermore known from EP 0 916 074 B1, EP 1 182 461 A2, WO 2009/005237 A2, EP 2 584 304 A1, DE 199 46 935 A1, U.S. Pat. No. 6,917,193 B1 and WO 2012/168635 A1.

SUMMARY OF THE INVENTION

It is therefore an object of the invention to provide a device which refines the prior art.

According to an embodiment of the invention, a magnetic field measuring device is provided, which includes a first semiconductor body having a surface formed in a first x-y plane, the first semiconductor body having two magnetic field sensors, spaced a distance apart on the surface, and the magnetic field sensors each measuring one z component of a magnetic field, and the x direction and the y direction and the z direction each being formed orthogonally to each other, and a first magnet being provided, which has a planar main extension surface formed in a second x-y plane, the direction of magnetization changing from a north pole to a south pole along the main extension surface on a symmetry surface of the magnet, and the first semiconductor body and the first magnet being rigidly fixed with respect to each other, and the first semiconductor body being situated in a translatory offset manner with respect to the first magnet in the x-y plane, and an offset between the first x-y plane and the second x-y plane formed in the z direction being smaller than a thickness of the first magnet formed in the z direction, and one of the two magnetic field sensors being disposed in the vicinity of the north pole, and the other of the two magnetic field sensors being disposed in the vicinity of the south pole, so that signals having opposite polarities with respect to each other are formed in a z component of the magnetic field.

The magnetic field measuring device can be designed to detect only one component of the magnetic field of the first magnet formed in the z direction. For this purpose, the magnetic field of the first magnet must be modulated with the aid of a ferromagnetic body, in particular a plate, in such a way that the magnetic field lines of the magnet are at least partially deflected in the z direction from the rest position in the x-y plane. The component of the magnetic field which occurs in the z direction can be implemented with the aid of a ferromagnetic plate situated at a distance in the z direction. Furthermore, no or essentially no z component of the magnetic field of the first magnet can be formed without the ferromagnetic plate situated at a distance in the z direction. The measuring device may be further formed into a magnetic field measuring system by adding the ferromagnetic body. The size of the deflection of the magnetic field lines from the x-y plane, due to the ferromagnetic body, can be significantly larger with a short distance in the z direction than with a greater distance.

An advantage of the device according to the invention is that the magnetic field measuring device doubles the signal deviation with the aid of two magnetic field sensors, which are spaced a distance apart from each other, and the special position with respect to the magnet, as soon as a z component occurs in the magnetic field, due to a deflection of the field lines from the rest position in the x-y plane. The difference from the two signals is ascertained for this purpose. Moreover, an offset of direct-current magnetic fields due to the difference measurements may be largely suppressed.

In an embodiment, the first magnet can have a cuboid design, including two lateral surfaces in the x-y plane and two front surfaces in the y-z plane, which are designed as pole surfaces.

In an embodiment, the two magnetic field sensors can be spaced a distance apart along the x direction, the straight connecting line through the two magnetic field sensors being disposed essentially or exactly orthogonally to the symmetry surface of the first magnet. In other words, the edge of the semiconductor body can be parallel or at least substantially parallel to the magnetization direction.

The x-y plane of the magnetic field sensors can be disposed on half the thickness of the first magnet or, in other words, to adjust the semiconductor body in the z direction in such a way that the x-y plane of the magnetic field sensors is situated in the middle of the magnet.

The length of the first semiconductor body can be essentially or exactly the same size or the same length in the x direction as the extension of the first magnet.

The first semiconductor body and the first magnet in the x-y plane can each have a quadrilateral shape, the first magnet and the first semiconductor body having a spacing in the y direction of less than ten millimeters, preferably less than two millimeters.

It is advantageous to design the two magnetic field sensors as Hall plates or to position them near the first x-y plane. As a result, the Hall plates are sensitive to only z components of the magnetic field of the first magnet.

In another embodiment, a second semiconductor body is provided, whose design can be identical or substantially identical to that of the first semiconductor body. The two semiconductor bodies can be disposed in the same x-y plane in such a way that the two straight connecting lines through the magnetic field sensors are essentially or exactly parallel to each other and are disposed, in particular, at the same distance from the magnet.

In an embodiment, a second magnet is provided, the first semiconductor body being disposed between the two magnets. An advantage is that this increases the magnetic flux density during a deflection of the field lines from the rest position, due to the two magnetic field sensors. The main extension surfaces of the two magnets can be provided in the same x-y plane.

An integrated circuit can be formed in the surface of the particular semiconductor body, the integrated circuit can be connected to the particular magnetic field sensors in an electrical operative connection.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 4:
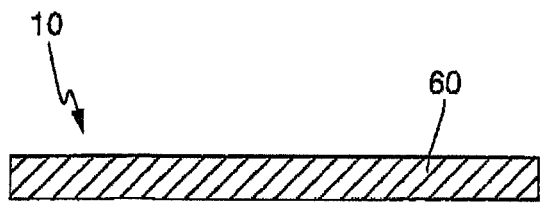
FIG. 4 shows an embodiment including two magnets.

The illustration in FIG. 4 shows a cross-sectional view of a first specific embodiment, according to the invention, of a magnetic field measuring device 10 which includes a first semiconductor body 20. First semiconductor body 20 has a surface, formed in a first x-y plane, first semiconductor body 20 having two magnetic field sensors 30 and 40, which are spaced a distance apart from each other on the surface. Magnetic field sensors 30 and 40 are each designed as Hall plates and each measure only one z component of a magnetic field of a first magnet 50. In the present case, the two magnetic field sensors 30 and 40 are provided close to the first x-y plane.

First magnet 50 has a planar main extension surface 55, formed in a second x-y plane, the direction of magnetization changing from a north pole N to a south pole S along main extension surface 55 on a symmetry surface 58 of first magnet 50. First semiconductor body 20 and first magnet 50 are rigidly fixed to each other. First magnet 50 has a cuboid design, including two lateral surfaces in the x-y plane and two front surfaces in the y-z plane, which are designed as pole surfaces.

In the present case, one of the two magnetic field sensors 30 is disposed in the vicinity of north pole N, and the other of the two magnetic field sensors 40 is disposed in the vicinity of south pole S, so that magnetic field sensors 30 and 40 each form signals, i.e., in the present case, Hall voltages having opposite polarities, in the presence of a z component of the magnetic field of first magnet 50.

The two magnetic field sensors 30 and 40 are spaced a distance apart from each other along the x direction. The straight connecting line through the two magnetic field sensors 30 and 40 is disposed essentially or exactly orthogonally to symmetry surface 58 of first magnet 50. It has been shown that it is advantageous to dimension the length of first semiconductor body 20 in the x direction to be essentially or exactly the same size as the extension of first magnet 50.

First semiconductor body 20 and first magnet 50 are preferably disposed on a metallic carrier, also referred to as a lead frame, which is not illustrated.

First semiconductor body 20 is situated in a translatory offset manner with regard to first magnet 50 in the x-y plane.

It is preferred that an offset between the first x-y plane and the second x-y plane, formed in the z direction, is smaller than a thickness of the first magnet formed in the z direction. The x-y plane of the magnetic field sensors is preferably disposed on half the thickness of first magnet 50.

A ferromagnetic plate 60, which is situated at a distance from first magnet 50, is disposed in the z direction. Ferromagnetic plate 60 preferably has a magnetically soft design is may also be referred to as a target. The location of the target is variable at least in the z direction, as shown by arrow 62. It can be understood that the magnetic field lines, which are not illustrated for reasons of clarity, are deflected in the direction of the z axis, due to the target. The magnitude of the deflection or flux change due to the two Hall plate as a function of the distance is illustrated in detail in FIG. 6.

Figure 1:
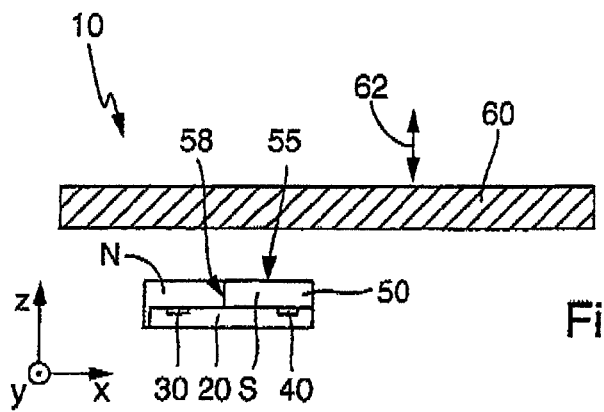
FIG. 1 shows a cross-sectional view of an embodiment according to the invention.
Figure 2:
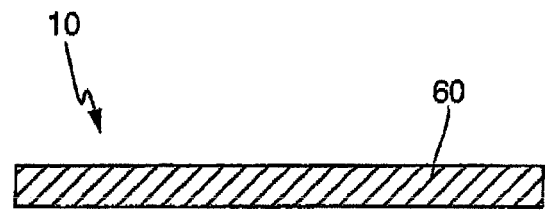
FIG. 2 shows a cross-sectional view, rotated ninety degrees, of the embodiment illustrated in FIG. 1.

FIG. 2 shows a cross-sectional view, rotated ninety degrees, of the specific embodiment illustrated in FIG. 1. Only the differences from the illustration in FIG. 1 are explained below. It is apparent that first semiconductor body 20 and first magnet 50 in the x-y plane each have a quadrilateral shape. First magnet 50 and first semiconductor body 20 are spaced a distance apart in the y direction. It is preferred to design the distance in the y direction as being less than two millimeters.

Figure 3:
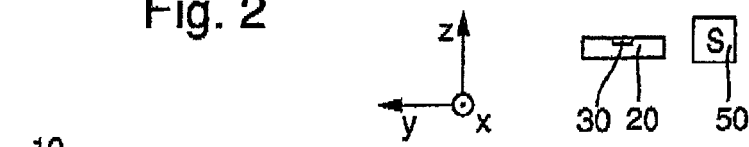
FIG. 3 shows an embodiment including two semiconductor bodies.
Figure 3:
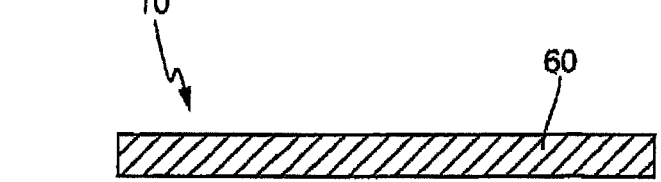

The illustration in FIG. 3 shows an embodiment, including first semiconductor body 20 and a second semiconductor body 70, which is situated at a distance in the y direction. Only the differences from the illustration in the preceding figures are explained below. First magnet 50 is disposed between the two semiconductor bodies 20 and 70. Second semiconductor body 70 has an identical design to first semiconductor body 20. The two semiconductor bodies 20 and 70 are disposed in the same x-y plane in such a way that the two straight connecting lines through the particular magnetic field sensors are essentially or exactly parallel to each other. It is desirable for the distance between the magnets and the magnetic field sensors to be preferably identical in the y direction.

The illustration in FIG. 4 shows an embodiment, including first semiconductor body 50 and a second magnet 80, which is situated at a distance in the y direction. Only the differences from the illustration in the preceding figures are explained below. First semiconductor body 20 is disposed between the two magnets 50 and 80. Second magnet 80 has an identical design to first magnet 50. The two magnets 50 and 80 are disposed in the same x-y plane in such a way that the lateral surfaces of magnets 50 and 80 are disposed parallel to each other. It is desirable for the distance between the two magnets 50 and 80 to be preferably identical in the y direction.

Figure 5:
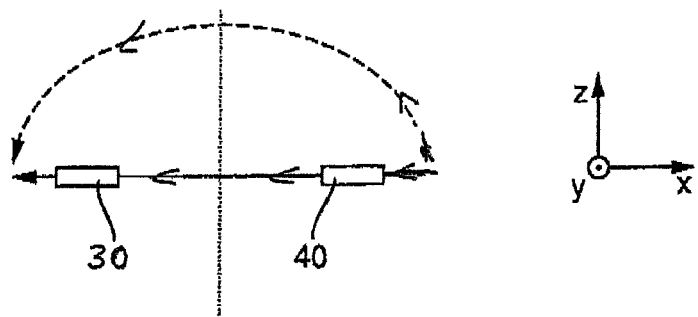
FIG. 5 shows a deflection of the magnetic field lines from the rest position in the x-y plane.

The deflection of the magnetic field lines from the x-y plane, which is designed as the rest position, is illustrated in FIG. 5. In the rest position, the field lines of first magnet 50 and/or second magnet 80 penetrate the two Hall sensors 30 and 40. If a target approaches from the z direction, the field lines are deflected in the z direction and vice versa. The same applies to a target with approaches from the −x] direction. In the present case, no z component of the magnetic field is present without a ferromagnetic plate situated at a distance in the z direction. Hall sensors 30 and 40 measure the z component of the magnetic field.

Figure 6:
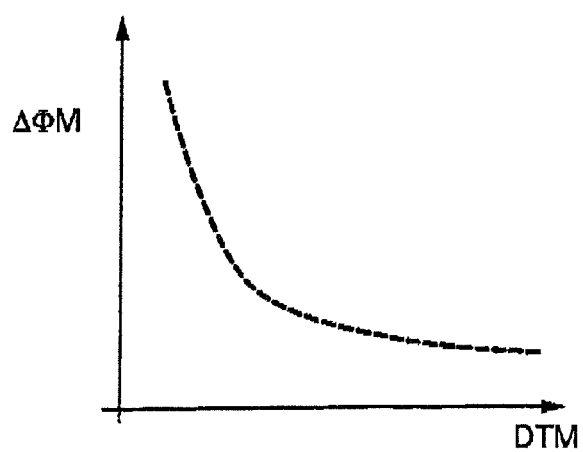
FIG. 6 shows a change in the magnetic flux density as a function of the distance of the ferromagnetic plate and magnet.

A non-proportional change in magnetic flux density □ ɸM as a function of distance DTM between the target and first magnet 50 and/or second magnet 80 is shown in the illustration in FIG. 6. Only the differences from the illustration in the preceding figures are explained below. It is apparent that flux density □ φM changes a great deal with a short distance DTM and very little with a great distance DTM.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A magnetic field measuring device comprising:
a first semiconductor body that has a surface formed in a first x-y plane, the first semiconductor body including two magnetic field sensors spaced a distance apart from each other on the surface, the magnetic field sensors each measuring one z component of a magnetic field, and an x direction and a y direction and a z direction each being formed orthogonally to each other; and
a first magnet that has a planar main extension surface formed in a second x-y plane, a direction of magnetization changing from a north pole to a south pole along a main extension surface on a symmetry surface of the first magnet;
wherein the first semiconductor body and the first magnet are mounted directly to each other,
wherein the first semiconductor body is disposed in a translatory offset manner to the first magnet in the x-y plane, and an offset between the first x-y plane and the second x-y plane formed in the z direction is smaller than a thickness of the first magnet formed in the z direction, and
wherein one of the two magnetic field sensors is disposed in a vicinity of the north pole and the other of the two magnetic field sensors is disposed in a vicinity of the south pole so that the magnetic field sensors form signals having opposite polarities in a presence of a z component of the magnetic field.

2. The magnetic field measuring device according to claim 1, wherein the first magnet has a cuboid design, two lateral surfaces in the x-y plane and two front surfaces in the y-z plane, which are designed as pole surfaces.

3. The magnetic field measuring device according to claim 1, wherein the two magnetic field sensors are spaced a distance apart along the x direction, and the straight connecting line through the two magnetic field sensors are disposed essentially or exactly orthogonally to the symmetry surface of the first magnet.

4. The magnetic field measuring device according to claim 1, wherein the x-y plane of the magnetic field sensors is disposed on half the thickness of the first magnet.

5. The magnetic field measuring device according to claim 1, wherein the length of the first semiconductor body in the x direction is essentially or exactly a same size as the extension of the first magnet.

6. The magnetic field measuring device according to claim 1, wherein the first semiconductor body and the first magnet in the x-y plane each have a quadrilateral shape, and wherein the first magnet and the first semiconductor body have a spacing in the y direction of less than ten millimeters or less than two millimeters.

7. The magnetic field measuring device according to claim 1, wherein the two magnetic field sensors are formed as Hall plates in or near the first x-y plane.

8. The magnetic field measuring device according to claim 1, wherein a second semiconductor body, whose design is substantially identical to that of the first semiconductor body, is provided, the two semiconductor bodies being disposed in the same x-y plane such that the two straight connecting lines are essentially or exactly parallel to each other, and the distance between the two straight connecting lines is distributed symmetrically around the magnets.

9. The magnetic field measuring device according to claim 1, wherein a second magnet is provided, and the first semiconductor body is disposed between the two magnets.

10. The magnetic field measuring device according to claim 1, wherein the main extension surfaces of the two magnets are formed in the same x-y plane.

11. The magnetic field measuring device according to claim 1, wherein an integrated circuit is formed in the surface of the particular semiconductor body, and wherein the integrated circuit establishes an electrical operative connection with the particular magnetic field sensors.

12. The magnetic field measuring device according to claim 1, wherein the component of the magnetic field, which occurs in the z direction, is implemented with the aid of a ferromagnetic plate situated at a distance in the z direction.

13. The magnetic field measuring device according to claim 12, wherein no z component of the magnetic field is present without a ferromagnetic plate situated at a distance in the z direction.

* * * * *